(12) United States Patent
Yoshida et al.

(10) Patent No.: US 6,852,601 B2
(45) Date of Patent: Feb. 8, 2005

(54) HEAT TREATMENT METHOD THAT INCLUDES A LOW NEGATIVE PRESSURE

(75) Inventors: Seiichi Yoshida, Sagamihara (JP); Takashi Tanahashi, Sagamihara (JP); Akira Onodera, Fuchu (JP); Motoki Akimoto, Sagamihara (JP)

(73) Assignee: Tokyo Electron Limited, Tokyo-To (JP)

( * ) Notice: Subject to any disclaimer, the term of this patent is extended or adjusted under 35 U.S.C. 154(b) by 387 days.

(21) Appl. No.: 10/106,120

(22) Filed: Mar. 27, 2002

(65) Prior Publication Data

US 2002/0110769 A1 Aug. 15, 2002

Related U.S. Application Data

(62) Division of application No. 09/620,912, filed on Jul. 20, 2000, now Pat. No. 6,409,503.

(30) Foreign Application Priority Data

Jul. 21, 1999 (JP) .......................................... 11-205551
Apr. 19, 2000 (JP) ...................................... 2000-117288

(51) Int. Cl.[7] .......................................... H01L 21/336
(52) U.S. Cl. ...................... 438/308; 438/378; 438/795
(58) Field of Search ................................ 438/308, 378, 438/706, 707, 710, 711, 714, 715, 716, 726, 727, 795, 798, 799, 905, 906, 909, 913, 974

(56) References Cited

U.S. PATENT DOCUMENTS

| | | | | |
|---|---|---|---|---|
| 5,273,423 A | * | 12/1993 | Shiraiwa ..................... | 432/241 |
| 5,316,518 A | * | 5/1994 | Challenger ................... | 454/187 |
| 5,387,265 A | * | 2/1995 | Kakizaki et al. ........... | 29/25.01 |
| 5,407,350 A | * | 4/1995 | Iwabuchi et al. ........... | 432/241 |
| 5,445,521 A | * | 8/1995 | Yamaguchi et al. ........... | 432/5 |
| 5,447,294 A | * | 9/1995 | Sakata et al. ............... | 266/257 |
| 5,462,397 A | * | 10/1995 | Iwabuchi ..................... | 414/217 |
| 5,695,564 A | * | 12/1997 | Imahashi ..................... | 118/719 |
| 5,697,749 A | * | 12/1997 | Iwabuchi et al. ........... | 414/217 |
| 5,820,366 A | * | 10/1998 | Lee ............................ | 432/241 |
| 5,961,323 A | | 10/1999 | Lee | |
| 6,042,372 A | | 3/2000 | Sakata et al. ............... | 414/938 |
| 6,174,366 B1 | * | 1/2001 | Ihantola ....................... | 117/84 |

FOREIGN PATENT DOCUMENTS

| | | |
|---|---|---|
| JP | 4-269824 | 9/1992 |
| JP | 5-29434 | 2/1993 |
| JP | 6-84737 | 3/1994 |
| JP | 6-177066 | 6/1994 |
| JP | 6-224144 | 8/1994 |
| JP | 6-224145 | 8/1994 |
| JP | 6-267933 | 9/1994 |

* cited by examiner

Primary Examiner—John F. Niebling
Assistant Examiner—Stanetta Isaac
(74) Attorney, Agent, or Firm—Smith, Gambrell & Russell, LLP

(57) ABSTRACT

When carrying workpieces from a loading area in which the workpieces are handled into a heat treatment furnace to make the workpieces subjected to a heat treatment process using a predetermined process gas, the loading area is evacuated and controlled at a predetermined low negative pressure. An exhaust for evacuating the loading area is connected to the loading area, and a controller controls the exhaust so that the loading area is maintained at the predetermined low negative pressure. A specific gas and particles contained in a gas discharged from the loading area are removed by filters.

3 Claims, 4 Drawing Sheets

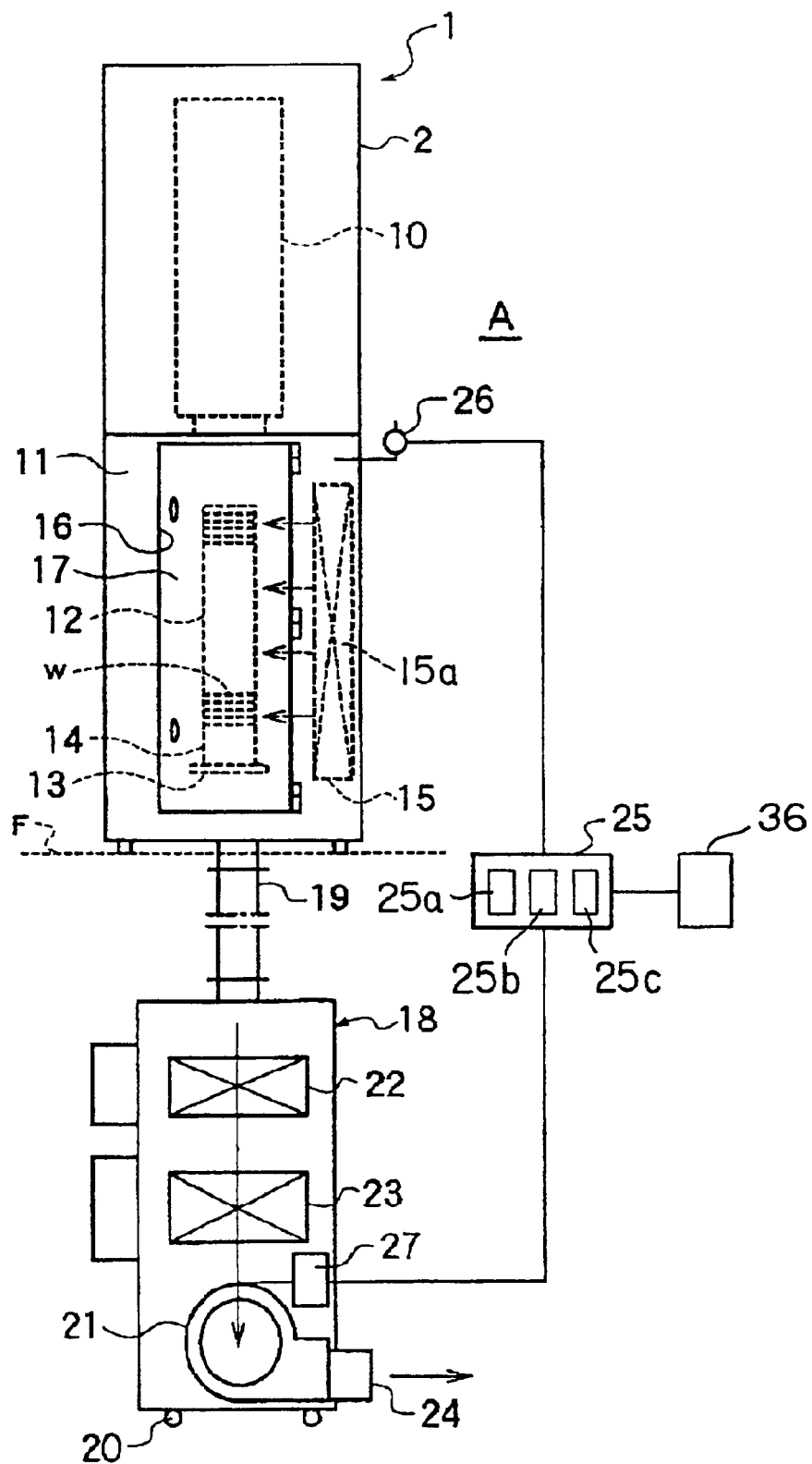
F I G. 1

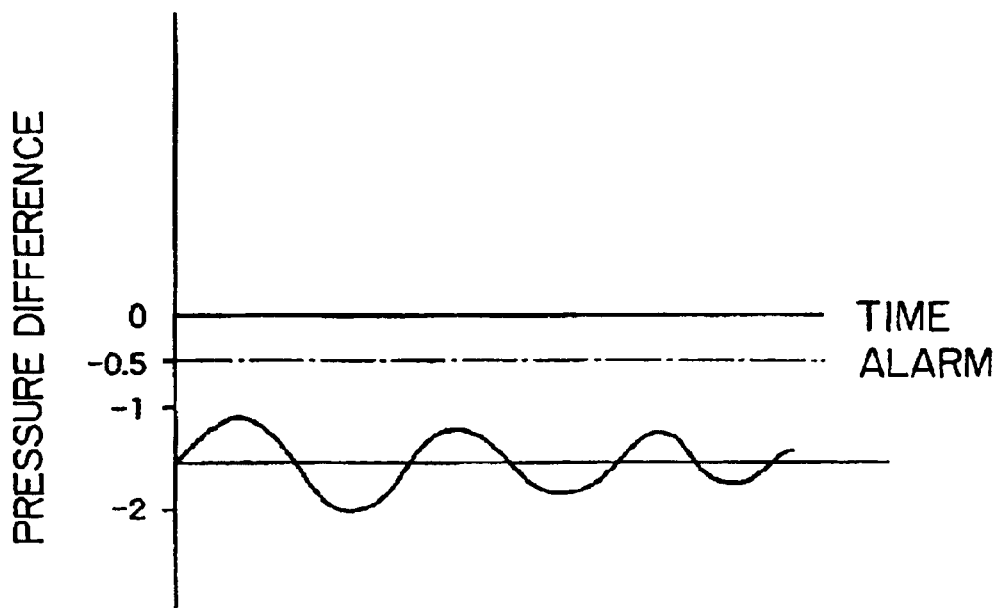
F I G. 3
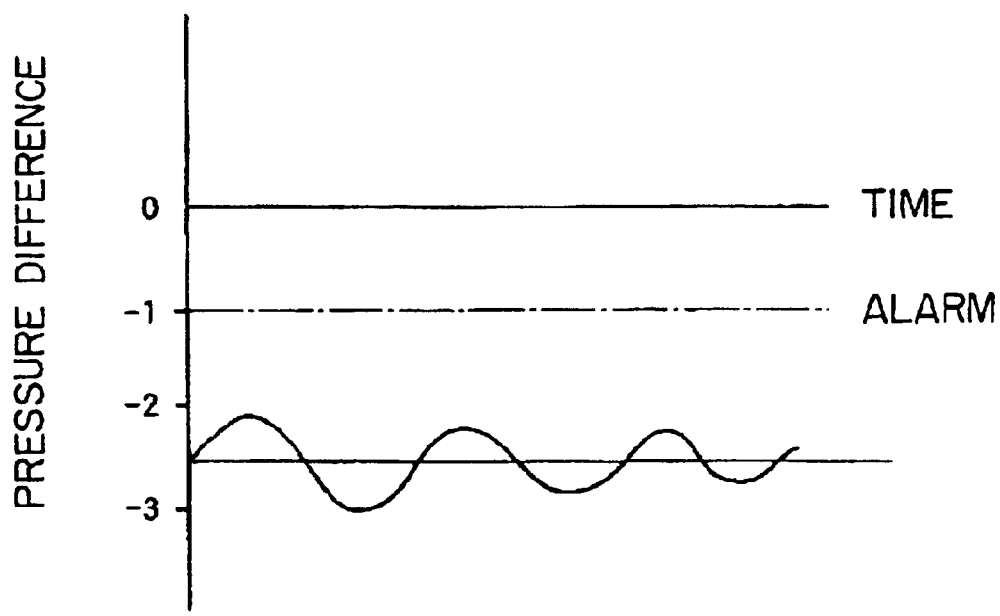
F I G. 4

HEAT TREATMENT METHOD THAT INCLUDES A LOW NEGATIVE PRESSURE

CROSS REFERENCE TO RELATED APPLICATION

This application is a division of Ser. No. 09/620,912, filed Jul. 20, 2000 now U.S. Pat. No. 6,409,503 being incorporated herein, in its, by reference

TECHNICAL FIELD

The present invention relates to a heat treatment method and a heat treatment apparatus.

BACKGROUND ART

Heat treatment apparatuses are used in fabricating semiconductor devices to heat-treat workpieces, such as semiconductor wafers, for oxidation, diffusion, CVD, annealing and the like. A known vertical heat treatment apparatus is provided with a heat treatment furnace capable of heat-treating a plurality of semiconductor wafers in an atmosphere of a predetermined process gas. This known heat treatment apparatus has a casing serving as an outer covering, and a vertical heat treatment furnace provided with an opening in a lower portion thereof and disposed in a back upper region in the casing. A loading area extends under the heat treatment furnace.

Arranged in the loading area are a transfer mechanism for transferring semiconductor wafers between a carrier, i.e., a carrying container capable of containing a plurality of semiconductor wafers, and a wafer boat, i.e., a holder for holding semiconductor wafers, and a lid lifting mechanism for vertically moving a lid for covering the opening of the heat treatment furnace, loaded with the wafer boat mounted on a heat insulating cylinder placed on the lid to carry the wafer boat through the opening into and to carry the same out of the heat treatment furnace. The casing is provided in its back part with an entrance to enable an operator to enter the loading area for maintenance and a door to close the entrance.

The heat treatment apparatus is controlled during a general process so that pressure in the loading area of the heat treatment apparatus is slightly higher than pressure in the environment surrounding the heat treatment apparatus by 3 to 5 Pa to prevent the leakage of the ambient atmosphere into the loading area.

When the heat treatment apparatus is used for a process that uses a dangerous gas, such as arsine ($AsH_3$), as a process gas, there is a danger of unstable substances, such as the dangerous gas and particles, remaining on semiconductor wafers held on the wafer boat leaking from the loading area outside the heat treatment apparatus even if the atmosphere in the heat treatment furnace is replaced with an inert gas, such as nitrogen gas ($N_2$). Therefore it is difficult to carry out a process that uses a dangerous gas by the heat treatment apparatus.

DISCLOSURE OF THE INVENTION

The present invention has been made in view of the foregoing circumstances and it is therefore an object of the present invention to provide a heat treatment method and a heat treatment apparatus capable of preventing the leakage of a specific gas and particles outside from a loading area thereof and of safely carrying out a process that uses a dangerous gas. Another object of the present invention is to provide a heat treatment apparatus capable of selectively carrying out a low-negative-pressure operation or a low-positive-pressure operation.

According to a first aspect of the present invention, a heat treatment method includes the steps of: transferring workpieces from a clean room outside a loading area to the loading area; carrying the workpieces from the loading area into a heat treatment furnace to subject the workpieces subjected to a predetermined heat treatment process; and returning the heat-treated workpieces from the heat treatment furnace to the loading area; wherein the loading area is evacuated to have a predetermined negative pressure relative to the clean room at least when returning the workpieces to the loading area.

The heat treatment method in the first aspect of the present invention may evacuate the loading area to the predetermined negative pressure relative to the clean room when carrying the workpieces from the loading area into the heat treatment furnace.

The heat treatment method in the first aspect of the present invention may evacuate the loading area to a low negative pressure in the range of −1 to −3 Pa relative to the clean room.

The heat treatment method according to the first aspect of the present invention may give an alarm when pressure in the loading area is in the range of −0.5 to −1 Pa relative to the clean room during the evacuation of the loading area.

The heat treatment method in the first aspect of the present invention may remove a specific gas and particles discharged from the loading area by filters during the evacuation of the loading area.

According to a second aspect of the present invention, a heat treatment apparatus includes: a loading area for storing workpieces transferred thereto from a clean room; a heat treatment furnace connected to the loading area to process workpieces transferred from transferred the loading area for performing a predetermined heat treatment process; an exhaust for evacuating the loading area; and a controller for controlling the exhaust so that the loading area is evacuated to have a predetermined negative pressure relative to the clean room.

In the heat treatment apparatus in the second aspect of the present invention, the exhaust may be provided with filters for removing a specific gas and particles discharged from the loading area.

In the heat treatment apparatus in the second aspect of the present invention, the filters may include an ULPA filter and a chemical filter.

The heat treatment apparatus in the second aspect of the present invention may further include a differential pressure gauge for measuring pressure difference between the loading area and the clean room, the differential pressure gauge being connected to the controller.

In the heat treatment apparatus in the second aspect of the present invention, the controller controls the pressure in the loading area at a low negative pressure in the range of −1 to −3 Pa relative to the clean room.

In the heat treatment apparatus in the second aspect of the present invention, an alarm device may be provided for giving an alarm when the pressure in the loading area is in the range of −0.5 to −1 Pa relative to the clean room.

According to a third aspect of the present invention, a heat treatment apparatus includes: a loading area for storing workpieces from a clean room; a heat treatment furnace connected to the loading area to process workpieces transferred from the loading area for performing a predetermined heat treatment process; an exhaust for evacuating the loading area; a gas supplier for supplying a gas into the loading area; and a controller for controlling the exhaust and the gas supplier.

The heat treatment apparatus according to the third aspect of the present invention may further include a selector means for selectively changing an operating mode of the controller between a low-negative-pressure operating mode in which at least the exhaust is controlled so that the loading area is set at a predetermined negative pressure relative to the clean room and a low-positive-pressure operating mode in which at least the gas supplier is controlled so that the loading area is set at a predetermined positive pressure relative to the clean room.

In the heat treatment apparatus according to the third aspect of the present invention, the exhaust may be provided with filters for removing a specific gas and particles received from the loading area.

In the heat treatment apparatus according to the third aspect of the present invention, the filters may include an ULPA filter and a chemical filter.

The heat treatment apparatus according to the third aspect of the present invention may further include a differential pressure gauge for measuring pressure difference between the loading area and the clean room, the differential pressure gauge being connected to the controller.

In the heat treatment apparatus according to the third aspect of the present invention, the controller may control the pressure in the loading area at a negative pressure in the range of −1 to −3 Pa relative to the clean room.

In the heat treatment apparatus according to the third aspect of the present invention, an alarm device may be provided for giving an alarm when the pressure in the loading area is in the range of −0.5 to −1 Pa relative to the clean room.

BRIEF DESCRIPTION OF THE DRAWINGS

FIG. 1 is a constructive view of a vertical heat treatment apparatus in a first embodiment according to the present invention;

FIG. 3 is a diagram of assistance in explaining a negative pressure control operation;

FIG. 4 is a diagram of assistance in explaining another negative pressure control operation.

BEST MODE FOR CRYING OUT THE INVENTION

Preferred embodiments of the present invention will be described with reference to the accompanying drawings. FIG. 1 is a constructive view of a vertical heat treatment apparatus in a first embodiment according to the present invention, FIG. 2 is a schematic longitudinal sectional view of the vertical heat treatment apparatus showing the internal parts arranged in a casing, FIG. 3 is a diagram of assistance in explaining a negative pressure control operation and FIG. 4 is a diagram of assistance in explaining another negative pressure control operation.

Figure 2:
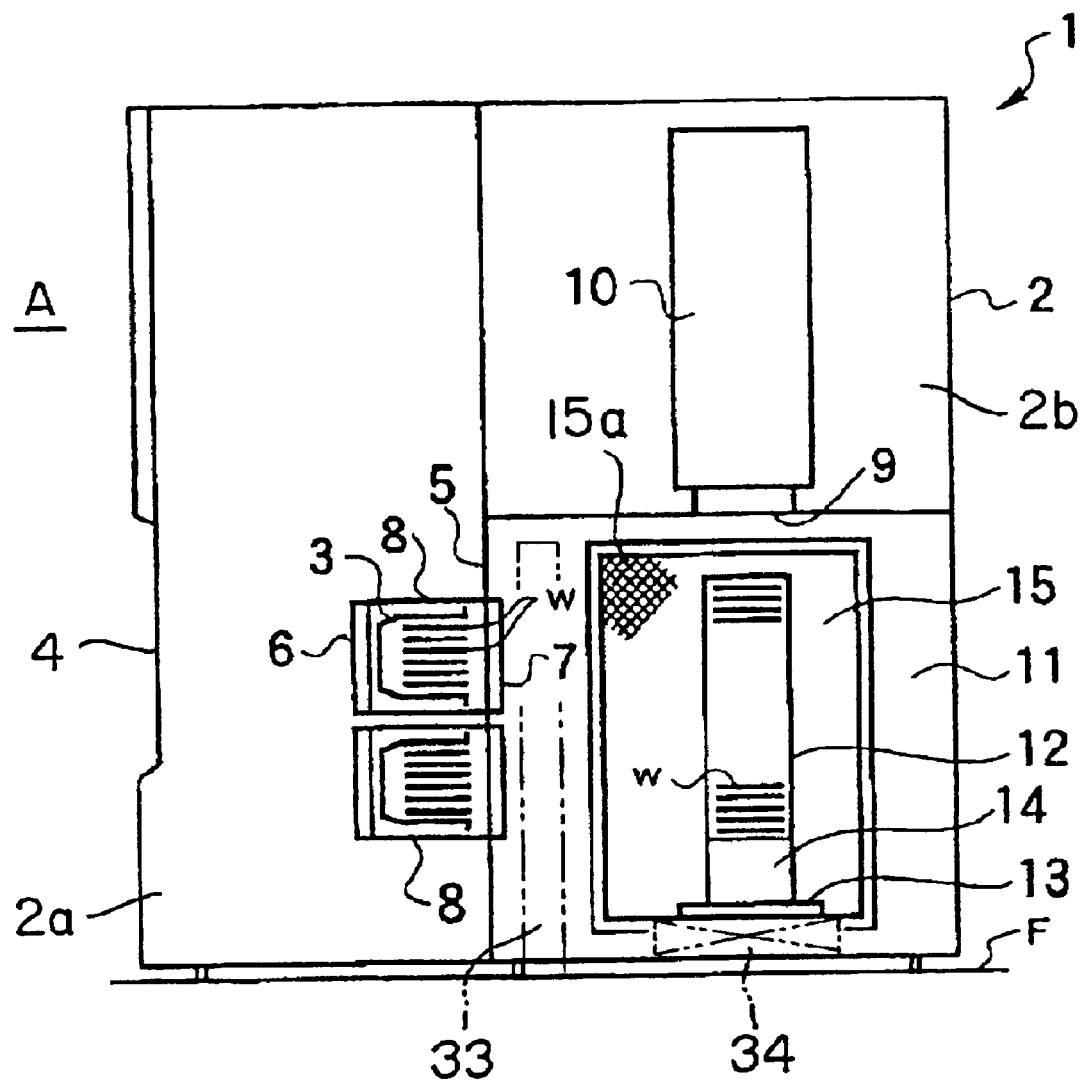
FIG. 2 is a schematic longitudinal sectional view of the vertical heat treatment apparatus showing the internal parts arranged in a casing.

Referring to FIGS. 1 and 2, a vertical heat treatment apparatus 1 installed on the floor F of a clean room A has a casing 2 serving as an outer covering. A gate 4 is formed in a front wall of the casing 2. A carrier (or cassette) 3, i.e., a carrying container, containing a plurality of semiconductor wafers W (for example, twenty-five semiconductor wafers) is carried into and carried out of the casing 2 through the gate 4. The interior of the casing 2 is partitioned by a partition wall 5 into a carrier handling section 2a, i.e., a front section, and a heat treatment section 2b, i.e., a back section. A storage shelves, not shown, for storing carriers 3 thereon and a carrying mechanism, not shown, for carrying the carriers 3 are installed in the front section (carrier handling section) 2a of the casing 2.

Pass boxes 8 each provided with a front door 6 and a back door 7 are disposed on the partition wall 5 the side of the carrier handling section 2a to contain the carriers 3 therein when hadling semiconductor wafers W. The pass boxes 8 can be connected to the heat treatment section 2b. In the embodiment shown in FIGS. 1 and 2, two pass boxes 8 are disposed so that one is located on top of the other.

A vertical heat treatment furnace 10 provided with a bottom opening 9 is installed in an upper region of the back section (heat treatment section) 2b, and a loading area 11 is defined under the vertical heat treatment furnace 10. Semiconductor wafers W are handled in the loading area 11. The loading area 11 is able to communicate with the interior of the pass boxes 8. The heat treatment furnace 10 comprises a vertically elongated reaction tube having an open lower end serving as the bottom opening 9, and capable of containing a wafer boat 12 and a heat insulating cylinder 14, a gas supply system for supplying a process gas, such as arsine ($AsH_3$), or an inert gas, such as nitrogen gas ($N_2$) into the reaction tube, an exhaust system for evacuating the reaction tube to a desired pressure, and a heater, not shown, for heating the interior of the reaction tube at a desired temperature.

Installed in the loading area 11 is a wafer transfer mechanism 33 that transfers semiconductor wafers W between the carrier 3 placed in the pass box 8 and a wafer boat 12 capable of holding a large number of semiconductor wafers W, such as about 150 semiconductor wafers W. A lifting mechanism 34 is installed in the loading area 11. The lifting mechanism 34 supports the wafer boat 12 through a heat insulating cylinder 14 and a lid 13 for closing the bottom opening 9 of the heat treatment furnace 10, and moves the lid 13 vertically to carry the wafer boat 12 and the heat insulating cylinder 14 into and to take the same out of the heat treatment furnace 10 and to close and open the bottom opening 9.

An air cleaner 15 is installed in a region of the loading area 11. The air cleaner 15 receives clean air from an external clean room A outside the casing 2 and discharges the clean air in a horizontal direction through a dust filter 15a. An operator is able to enter the back section 2b of the casing 2 for maintenance work through an entrance 16 having a door 17 to close the entrance 16. A gas, such as clean air may be supplied directly into the loading area 11 through a duct from a gas source other than the clean room A without passing the gas through the air cleaner 15.

In case the vertical heat treatment apparatus 1 carries out a process that uses a dangerous gas, such as arsine ($AsH_3$), an exhaust unit 18 is connected to the casing 2 through a duct 19 to prevent the leakage of the specific gas (the dangerous gas) and particles from the loading area 11 outside the vertical heat treatment apparatus 1 by maintaining the loading area 11 at a low negative pressure relative to the clean room A. In the vertical heat treatment apparatus shown in FIGS. 1 and 2, the exhaust unit 18 is installed under the floor of the clean room A or in a room under the clean room A. The reason why the loading area 11 is maintained at a low negative pressure, is to suppress the flow of dust into the loading area 11 from outside and to keep the loading area 11 clean.

The exhaust unit 18 has casters 20 to facilitate moving the same and is provided with a fan 21 for sucking the atmosphere of the loading area 11 to discharge air thereof outside through an exhaust opening 24. The exhaust unit 18 is provided with an ULPA filter 22 and a chemical filter 23 to remove harmful gases and particles from the air discharged from the loading area 11.

The ULPA filter 22 filters out mainly particles and chemical filter 23 filters out mainly gaseous substances. Preferably, the ULPA filter 22 and the chemical filter 23 are disposed removably in a series arrangement in an upstream portion of an exhaust passage from the fan 21. Preferably, the exhaust opening 24 of the exhaust unit 18 is connected to an exhaust system of the plant.

The vertical heat treatment apparatus 1 is provided with a controller 25 that controls the exhaust unit 18 to maintain the loading area 11 at a fixed low negative pressure, and a pressure gauge (differential pressure gauge) 26 for measuring pressure in the loading area 11, preferably, for measuring the pressure difference between the loading area 11 and the atmosphere (the clean room A of the atmospheric pressure). The exhaust unit 18 is provided with an inverter 27 for controlling the rotating speed of the fan 21.

The controller 25 includes a setting unit 25a for setting a desired pressure, preferably, a desired pressure difference, a comparing unit 25b for comparing a measured pressure measured by the pressure gauge 26 with the set pressure set by the setting unit 25a, and a regulating unit 25c for giving a control signal to the inverter 27 to control the rotating speed of the fan 21 of the exhaust unit 18 according to an actuating signal provided by the comparing unit 25b.

Preferably, the controller 25 makes an alarm device 36 give an alarm and at the same time stops a heat treatment process when the pressure difference between the loading area 11 and the external clean room A is in the range of −0.5 to −1 Pa, and controls the pressure difference between the loading area 11 and the external clean room A in the range of −1 to −3 Pa to insure safety and to maintain the loading area 11 in a predetermined cleanliness of, for example, air cleanliness class 10 (ten particles of particle sizes not smaller than 1 $\mu$m in 1 ft$^3$ of air).

In a state where the loading area 11 is at a low negative pressure relative to the clean room A, the pressure difference between the loading area 11 and the clean room A is in the range of −1 to −3 Pa.

More preferably, an alarm is given and the heat treatment process is stopped when the pressure difference is −0.5 Pa and the pressure in the loading area is regulated so that the pressure difference is in the range of −1 to −2 Pa as shown in FIG. 3. An alarm may be given and the heat treatment process may be stopped when the pressure difference coincides with −1 Pa, and the pressure difference may be controlled in the range of −2 to −3 Pa as shown in FIG. 4.

The operation of the vertical heat treatment apparatus thus constructed and a heat treatment method will be described hereinafter.

Semiconductor wafers W contained in the carriers 3 are carried from the clean room A outside the loading area 11 to the carrier handling section 2a of the casing 2, then the semiconductor wafers W are transferred to the loading area 11 through the pass boxes 8. The semiconductor wafers W are transferred from the carriers 3 to the wafer boat 12 by the transfer mechanism 33 in the loading area 11. The wafer boat 12 holding the semiconductor wafers W is supported on the heat insulating cylinder 14 placed on the lid 13. The lifting mechanism 34 lifts up the lid 13 supporting the wafer boat 12 to carry the wafer boat 12 holding the semiconductor wafers W into the heat treatment furnace 10 and to close the bottom opening 9 of the heat treatment furnace 10 with the lid 13. The gas supply system supplies a predetermined process gas, such as arsine ($AsH_3$), into the heat treatment furnace 10, the exhaust system maintains the interior of the heat treatment furnace 10 at a predetermined pressure and the heater heats the interior of the heat treatment furnace 10 at a predetermined temperature to process the semiconductor wafers W by a predetermined heat treatment process, such as a low-pressure CVD process.

After the completion of the heat treatment process, the gas left in the heat treatment furnace 10 is replaced with an inert gas, such as nitrogen gas ($N_2$). Then, the lifting mechanism 34 lowers the lid 13 to open the bottom opening 9 and to return the waferboat 12 into the loading are all. Sometimes, substances remaining in an unstable state in the heat treatment furnace 10 and on the semiconductor wafers W, such as harmful gases and particles, float in the loading area 11. If the loading area 11 is set at a positive pressure or a low positive pressure, the harmful gases and particles will leak outside the vertical heat treatment apparatus 1 through gaps in the casing 2 formed by plate work.

However, since the loading area 11 is evacuated at a low negative pressure relative to the clean room A by the exhaust unit 18 while the heat treatment apparatus 1 is in operation (during the heat treatment operation and before and after the heat treatment operation), the leakage of the harmful gases and the particles from the loading area 11 into the clean room A can be prevented. Since the exhaust unit 18 is provided with the filters 22 and 23 for filtering out the harmful gases and particles contained in the air discharged from the loading area 11, the harmful gases and the particles can be removed. Consequently, the heat treatment apparatus and the heat treatment method are able to carry out a process that uses a dangerous gas safely.

In the heat treatment method, semiconductor wafers W are carried from the loading area 11 in which the semiconductor wafers W are handled into the heat treatment furnace 10, subjected to a predetermined heat treatment process in the atmosphere of the predetermined process gas, and then returned to the loading area 11. During these whole processes the loading area 11 is evacuated to regulate the pressure in the loading area 11 at the predetermined low negative pressure relative to the clean room A. Therefore, the leakage of harmful gases and particles from the loading area 11 outside the heat treatment apparatus can be prevented and the process that uses a dangerous gas can be safely carried out.

Since the harmful gases and the particles contained in the air discharged from the loading area 11 are filtered out by the filters 22 and 23, a process that uses a dangerous gas can be safely carried out. The step of evacuating the loading area 11 to maintain the loading area 11 at a fixed low negative pressure relative to the clean room A and the step of filtering out harmful gases and particles contained in the air discharged from the loading area 11 by the filters 22 are carried out simultaneously or in parallel.

When the pressure difference between the loading area 11 and the external clean room A is in the range of −0.5 to −1

Pa, an alarm is given and the heat treatment process is stopped, and the pressure difference between the loading area 11 and the external clean room A is regulated in the range of −1 to −3 Pa. Consequently, safety can be insured and the loading area 11 can be maintained in a predetermined cleanliness of, for example, air cleanliness class 10. The leakage of harmful gases and particles from the loading area 11 outside the heat treatment apparatus 1 can be prevented and the degradation of the cleanliness of the loading area 11 by the suction of ambient air into the heat treatment apparatus 1 can be prevented by controlling the pressure in the loading area 11 so that the pressure difference between the loading area 11 and the external clean room A is in the range of −1 to −3 Pa. Thus, the loading area 11 can be maintained in the predetermined cleanliness of, for example, air cleanliness class 10 or higher.

The frequent operation of the alarm device (generation of an alarm and stoppage of the heat treatment process) can be prevented by maintaining the loading area 11 at the fixed low negative pressure as mentioned above. If the pressure difference between the loading area 11 and the external clean room A decreases to a value in the range of −0.5 to −1 Pa due to the malfunction of the exhaust unit 18, an alarm is given and the heat treatment process is stopped. Therefore, the leakage of harmful gases and particles from the loading area 11 outside the heat treatment apparatus 1 can be prevented.

In the above-mentioned heat treatment apparatus, semiconductor wafers W are carried from the loading area 11 in which the semiconductor wafers W are handled into the heat treatment furnace 10 and are processed by the heat treatment process using the predetermined process gas, then the semiconductor wafers W are returned to the loading area. During these processes, the exhaust unit 18 evacuates the loading area 11, and the controller 25 controls the exhaust unit 18 to maintain the loading area 11 at the predetermined low negative pressure. Therefore, the leakage of the harmful gases and the particles from the loading area 11 into the external clean room A can be prevented and the process that uses a dangerous gas can be safely carried out. The harmful gases and the particles contained in the air discharged from the loading area 11 can be filtered out by the filters 22 and 23.

The exhaust unit 18 provided with the fan 21, the ULPA filter 22 and the chemical filter 23 is compact in construction, and the loading area 11 can be easily used at the low negative pressure and the present invention is readily applicable to an existing heat treatment apparatus.

In the foregoing embodiment, the exhaust unit 18 is operated while the heat treatment apparatus 1 is in operation. The exhaust unit 18 may be operated only during an operation for returning the semiconductor wafers W from the heat treatment furnace 10 to the loading area 11. The exhaust unit 18 may be operated during operations for carrying the semiconductor wafers W from the loading area 11 into the heat treatment furnace 10 and returning the semiconductor wafers W from the heat treatment furnace 10 to the loading area 11.

Figure 5:
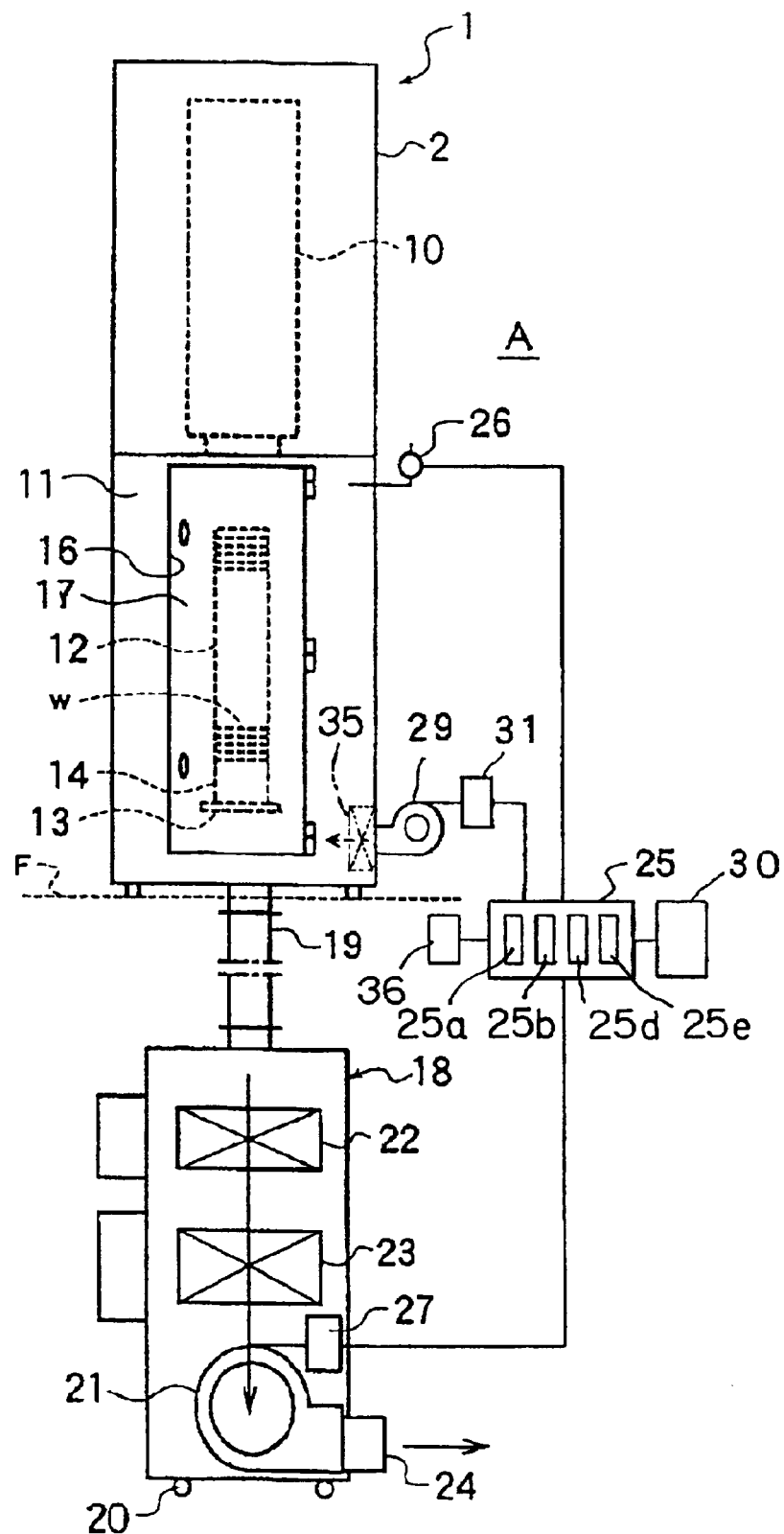
FIG. 5 is a constructive view of a vertical heat treatment apparatus in a second embodiment according to the present invention.

A vertical heat treatment apparatus 1 in a second embodiment according to the present invention is shown in FIG. 5, in which parts like or corresponding to those shown in FIG. 1 are denoted by the same reference characters and the detailed description thereof will be omitted. Referring to FIG. 5, the heat treatment apparatus 1 is provided with an exhaust unit 18, i.e., an exhaust, for evacuating a loading area 11, and a blower 29, i.e., a gas supplier, for supplying a gas, such as clean air, into the loading area 11. A filter or an air cleaner 35 may be interposed between the blower 29 and the loading area 11 or in the loading area 11 to clean the air taken from a clean room A.

Preferably, the gas supplier is the blower 29 and air in the clean room A is supplied into the loading area 11 by the blower 29. Clean air may be supplied directly from a clean air source other than the clean room A through a duct into the loading area 11. Although it is preferable to supply clean air into the loading area 11 by the gas supplier, an inert gas may be supplied into the loading area 11.

The vertical heat treatment apparatus 1 is provided with a controller 25 that controls the blower 29 and the exhaust unit 18 so that the loading area 11 is maintained at a predetermined low negative pressure in the range of about −1 to about −3 Pa relative to the space (clean room A) outside the loading area 11, or at a predetermined low positive pressure in the range of about 3 to about 5 Pa relative to the clean room A. The controller 25 is connected to a selector switch 30 that selectively changes an operating mode of the controller 25 between a low-negative-pressure operating mode and a low-positive-pressure operating mode. The rotating speed of the blower 29 is controlled by an inverter 31.

The controller 25 includes a setting unit 25a for setting a desired pressure, preferably, a desired pressure difference, a comparing unit 25b for comparing a measured pressure measured by a pressure gauge 26 with the set pressure set by the setting unit 25a, a first regulating unit 25d that gives a control signal to an inverter 27 to control the rotating speed of a fan 21 of the exhaust unit 18 according to an actuating signal provided by the comparing unit 25b, and a second regulating unit 25e that gives a control signal to the inverter 31 to control the rotating speed of the blower 29 according to an actuating signal provided by the comparing unit 25b.

In this vertical heat treatment apparatus 1 thus constructed, workpieces, such as semiconductor wafers W, are carried from the loading area 11 into a heat treatment furnace 10, subjected to a predetermined heat treatment process in an atmosphere of a predetermined process gas, then returned to the loading area 11. During these processes, the blower 29, i.e., the gas supplier supplies a gas, such as clean air, into the loading area 11, and the exhaust unit 18, i.e., the exhaust evacuates the loading area 11. The controller 25 controls the blower 29 and the exhaust unit 18 to maintain the loading area 11 at the predetermined low negative pressure or the predetermined low positive pressure, after a selector switch 30, i.e., a selector selectively changes the operating mode of the controller 25 between the low-negative-pressure operating mode and the low-positive-pressure operating mode. Thus, the vertical heat treatment apparatus in the second embodiment is the same in effect as the vertical heat treatment apparatus in the first embodiment and is capable of operating selectively in either the low-negative-pressure operating mode or the low-positive-pressure operating mode.

The controller 25 controls the respective rotating speeds of the blower 29 and the fan 21 of the exhaust unit 18 to regulate supply rate at which clean air is supplied by the blower 29 and discharge rate at which the gas is discharge by the exhaust unit 18. When the heat treatment apparatus is operated in the low-negative-pressure operating mode, the blower 29 and the fan 21 are controlled so that the discharge rate is higher than the supply rate. Consequently, the loading area 11 is maintained at a low negative pressure so that the pressure difference between the loading area 11 and the space outside the loading area 11 is in the range of, for example, about −1 to about −3 Pa. In the low-negative pressure operating mode, the fan 21 may be stopped and only the exhaust unit 18 may be controlled by the controller 25.

When the heat treatment apparatus is operated in the low-positive-pressure operating mode, the blower 29 and the fan 21 are controlled so that the supply rate is higher than the discharge rate. Consequently, the loading area 11 is maintained at a low positive pressure so that the pressure difference between the loading area 11 and the space outside the loading area 11 is in the range of, for example, about +1 to about +5 Pa. Since either the low-negative-pressure operating mode or the low-positive pressure operating mode is selected in this manner, the operating mode of the vertical heat treatment apparatus 1 can be determined taking into consideration the property of the process gas (whether the process gas is harmful or not), which enhances the utility of the vertical heat treatment apparatus 1. In the low-positive-pressure operating mode, the exhaust unit 18 may be stopped and only the fan 21 may be controlled by the controller 25.

In the case where the process gas is harmful, the loading area 11 is maintained at the low negative pressure, while in the case where the processing gas is not harmful, the loading area is maintained at the low positive pressure.

Although the invention has been described in its preferred embodiments, the present invention is not limited thereto in its practical application and various changes and variations may be made therein without departing from the scope of the present invention. For example, the exhaust unit 18 does not need necessarily to be installed under the floor of the clean room A or in a room under the clean room A as shown in the drawings, but may be installed on the floor F on which the vertical heat treatment apparatus 1 is installed or may be installed at any other suitable place. The duct 19 attached to the exhaust unit 18 does not need necessarily to be connected to the bottom of the casing 2 as shown in the drawings, but may be connected to an optional part of the casing 2, such as the back wall of the casing 2. The present invention is applicable not only to a process that uses arsenic, but also to processes respectively using all kinds of dangerous gases. The present invention is applicable not only to vertical heat treatment apparatuses, but also to horizontal heat treatment apparatuses.

The present invention exercises the following effects.

(1) According to the present invention, the heat treatment method that carries workpieces from the loading area in which the workpieces are handled into the heat treatment furnace and subjects the workpieces to a heat treatment process in an atmosphere of a predetermined process gas includes evacuation of the loading area for maintaining the loading area at a low negative pressure. Consequently, the leakage of a specific gas and particles from the loading area outside the heat treatment apparatus can be prevented, so that a process that uses a dangerous gas can be safely carried out.

(2) According to the present invention, a specific gas and particles contained in the gas discharged from the loading area are filtered out by the filters. Thus, the specific gas and the particles can be removed, so that a process that uses a dangerous gas can be more safely carried out.

(3) According to the present invention, an alarm is given and the heat treatment process is stopped when the pressure difference between the loading area and the space outside the loading area is in the range of −0.5 to −1 Pa and the pressure difference therebetween is regulated in the range of −1 to −3 Pa. Thus, safety is insured and the loading area can be maintained substantially in a cleanliness of air cleanliness class 10.

(4) According to the present invention, the heat treatment apparatus that carries workpieces from the loading area in which the workpieces are handled into the heat treatment furnace and subjects the workpieces to a heat treatment process in an atmosphere of a predetermined process gas includes the exhausting means (the exhaust unit) for evacuating the loading area and the controller that controls the evacuating means so that the loading area is maintained at a fixed low negative pressure. Thus, the leakage of a specific gas and particles from the loading area outside the heat treatment apparatus can be prevented by a simple mechanism and a process that uses a dangerous gas can be safely carried out.

(5) According to the present invention, the heat treatment apparatus that carries workpieces from the loading area in which the workpieces are handled into the heat treatment furnace and subjects the workpieces to a heat treatment process in an atmosphere of a predetermined process gas includes the gas supply means (the gas supplier) for supplying a gas into the loading area, the exhausting means for evacuating the loading area, the controller that controls the gas supply means and the evacuating means so that the loading area is maintained at a fixed low negative pressure and the selector means connected to the controller to change the operating mode of the controller selectively between the low-negative-pressure operating mode and the low-positive-pressure operating mode. Thus, the heat treatment apparatus can be operated so as to comply with a process to be carried out in either the low-negative-pressure operating mode or the low-positive-pressure operating mode.

(6) According to the present invention, the exhausting means is provided with the filters for filtering out a specific gas and particles contained in the gas discharged from the loading area. Thus, the specific gas and the particles contained in the gas discharged from the loading area can be filtered out and hence a process that uses a dangerous gas can be safely carried out.

(7) According to the present invention, the exhausting means is the exhaust unit including a fan, and the exhaust unit is provided with the ULPA filter and the chemical filter. Thus, the loading area can be easily maintained at a low negative pressure by a compact mechanism.

What is claimed is:

1. A heat treatment method comprising the steps of:
    transferring workpieces from a clean room outside a loading area to the loading area;
    carrying the workpieces from the loading area into a heat treatment furnace to subject the workpieces to a predetermined heat treatment process; and
    returning the heat-treated workpieces from the heat treatment furnace to the loading area;
    wherein the loading area is evacuated to have a predetermined negative pressure relative to the clean room at least when returning the workpieces to the loading area, and
    the loading area is evacuated to have a low negative pressure in the range of −1 to −3 Pa relative to the clean room.

2. The heat treatment method according to claim 1, wherein
    an alarm is given when pressure in the loading area is in the range of −0.5 to −1 Pa relative to the clean room during the evacuation of the loading area.

3. The heat treatment method according to claim 1, wherein
    a specific gas and particles discharged from the loading area are filtered out by filters during the evacuation of the loading area.

* * * * *